United States Patent
Keem et al.

[11] Patent Number: 5,268,216
[45] Date of Patent: Dec. 7, 1993

[54] MULTILAYER SOLID LUBRICANT COMPOSITE STRUCTURES AND METHOD OF MAKING SAME

[75] Inventors: John E. Keem, Bloomfield Hills, Mich.; Bruce Kramer, Washington, D.C.

[73] Assignee: Ovonic Synthetic Materials Company, Inc., Troy, Mich.

[21] Appl. No.: 666,531

[22] Filed: Mar. 7, 1991

Related U.S. Application Data

[63] Continuation-in-part of Ser. No. 631,310, Dec. 21, 1990, abandoned.

[51] Int. Cl.$^5$ .............................................. B32B 7/02
[52] U.S. Cl. ................................ 428/216; 428/408; 428/469; 428/472; 428/698; 428/701; 428/702; 428/704
[58] Field of Search ............... 428/704, 698, 472, 469, 428/216, 701, 702, 408

[56] References Cited

U.S. PATENT DOCUMENTS

| | | | |
|---|---|---|---|
| Re. 32,464 | 7/1987 | Aine | 428/694 |
| 3,772,086 | 11/1973 | Maquelin | 428/698 |
| 4,204,886 | 5/1980 | Bens | 428/469 |
| 4,293,171 | 10/1981 | Kakumoto et al. | 384/625 |
| 4,508,396 | 4/1985 | Doi et al. | 384/463 |
| 4,680,218 | 7/1987 | Kimura et al. | 428/195 |
| 4,975,340 | 12/1990 | Suhr et al. | 428/698 |
| 4,996,108 | 2/1991 | Divigalpitiya et al. | 428/698 |
| 5,002,798 | 3/1991 | Donley et al. | 427/42 |

*Primary Examiner*—A. A. Turner
*Attorney, Agent, or Firm*—Rothwell, Figg, Ernst & Kurz

[57] ABSTRACT

A composite, multilayer thin film solid lubricant structure having multiple thin film layers of solid lubricant interleaved by thin film interlayers which interrupt propagation of growth defects in the deposition process.

6 Claims, 4 Drawing Sheets

MULTILAYER SOLID LUBRICANT COMPOSITE STRUCTURES AND METHOD OF MAKING SAME

This invention was made with Government support under Contract N00014-87-C-0273 awarded by the Department of the Navy. The Government has certain rights in this invention.

RELATED APPLICATION

This is a continuation-in-part application of application Ser. No. 07/631,310, filed Dec. 21, 1990 now abandoned, entitled MULTILAYER SOLID LUBRICANT COMPOSITE STRUCTURES AND METHOD OF MAKING SAME, in the name of John E. Keem and assigned to the same assignee as the present application.

FIELD OF THE INVENTION AND BACKGROUND

The present invention relates to the field of thin film solid lubricant materials and structures and to methods of making the same.

In the formation of solid film structures by deposition and growth of the constituent species on a substrate, such as by chemical vapor deposition techniques, sputtering, evaporation and the like, columnar growth structures typically form as an inherent characteristic of the film growth kinetics While the precise scientific reasons for the formation of such columnar growth structures are not fully understood, it is thought that perhaps the tendencies of the kinetics of film growth as they apply to thermodynamically preferred growth structures of the arriving species of deposition as they grow on the substrate tend toward the formation of such columnar structures in the growth process.

At any rate, the formation of such columnar structures in the deposition of such film structures on substrates appears to occur as an inherent characteristic of the growth process In the case of the deposition of thin films of solid $MoS_2$ using, for example, sputtering deposition techniques, the aforementioned columnar growth structure may typically take the form of the structure illustrated in FIG. 1, which shows a prior art structure of such a $MoS_2$ film.

Such $MoS_2$ solid films are used, for example, as solid thin film lubricants which are found to be particularly advantageous for certain applications, such as, for example, high altitude and space applications and other low pressure or vacuum environments. However, the use of such deposited $MoS_2$ films as solid lubricants has been severely limited by the unavoidable presence of the aforementioned columnar structures in such films.

This same problem of columnar growth occurs in various types of deposited thin films The phenomenon begins to occur in each case at a critical level of thickness in the growth of the thin film. At this critical level of thickness, further growth in thickness is accompanied by increasingly distinct "columns" of growth which develop as adjacent and even touching but structurally separate regions of the film structures. Such columnnar growth structures not only result in the deterioration of the structural integrity of the films in the regions of the columnar structures, but they also result in a reduction in the density and corrosion resistance of the films.

The formation of such columnar growth structures appears to be generic to the process of synthesis of materials by vapor phase deposition, particularly at relatively low substrate temperatures where "metallurgical grains tend to be columnar . . . (with) a growth structure defined by voided boundaries that are also columnar". See J. Thornton, J. Vac. Sci. Technol A4 (6), 3059, (1986). Observation of such columnar structures and theoretical descriptions of their origin are well documented in vapor phase deposition processes. See also, for example, J. A. Thornton, Ann. Rev. Mater. Sci., 7, 239 (1977), and A. Mazor et al., Phys. Rev. Let., 60, 424 (1988). It is believed that similar effects are observed in certain plating processes.

The formation of such columnar structures in solid lubricant films, such as $MoS_2$ films, severely limits the performance of such films in that the columns break off relatively easily and are subject to removal by wear or adhesion to other parts (such as ball retaining rings) and are thus lost as part of the effective film thickness. This failure mode of the columnar structures adversely affects performance and severely limits the life of the coating.

In the case of $MoS_2$ films as discussed above, attempts have been made in the prior art to deal with the problem of the formation of such columnar structures in the growth pattern. One such attempt involves the incorporation in the deposition process of additional elements in the film structure which are intended to interfere with and suppress the formation of such columnar structures A discussion of the problem and the attempts made in the prior art to deal with it is set forth in a paper entitled "A Review of Recent Advances in Solid Film Lubrication" by T. Spalvins, published in J. Vac. Sci. Technol A 5 (2), Mar/Apr 1987. As described in the aforementioned Spalvins paper, the thin film sputter deposition of $MoS_2$ first forms a ridge-type structure which then transforms into an equiaxed, dense transition zone as the thickness increases before it grows into a columnar fiberlike structural network. Such a prior art structure of a deposited $MoS_2$ film is shown in FIG. 1 of the drawings of this application.

As pointed out by Spalvins, the equiaxed zone is basically pore free and has a densely packed structure between the equiaxed crystallites and normally does not extend more than about 2,000 angstroms in thickness. The fibers of the columnar structure consist of vertical columns about 2,500 angstroms in diameter which extend perpendicular to the substrate and are separated by open voided boundaries a few hundred angstroms wide. Such deposited films always have a tendency to break within the columnar fiberlike region above the equiaxed zone in a manner which is illustrated in the referenced Spalvins paper.

In the reference Spalvins paper, there is discussed attempts to strengthen the structural integrity of sputtered $MoS_2$ films "especially in the columnar zone" by introducing gold and nickel dispersions into the sputtered films. However, since the formation of columnar structures appears to be generic, and independent to a great extent of the materials being synthesized, such efforts to stifle or supress formation of the columnar growth structures, or to strengthen the mechanical integrity of such structures, have not been successful.

In addition to the irregular growth structures noted by Spalvins, other structural growth deviations have been observed in the case of $MoS_2$ films for thicknesses in the range of only a few hundred angstroms, i.e. for thicknesses approaching say 100 or 200 angstroms. The nanostructure of $MoS_2$ nucleation and growth has been observed by many investigators. Such investigations have shown early growth film morphology consisting of anisotropic (platelike) islands occuring in some cases at thicknesses of just over 100 Angstroms. These structural deviations have also been found to limit the performance and life of such structures as solid lubricants.

Another approach to the improvement of the performance of $MoS_2$ films, while not addressing the inherent limitations of the columnar structures, has been to employ a two layer coating structure in which a layer of a hard, high modulus material is positioned between the $MoS_2$ film and the substrate. This hard layer decreases the deflection between the $MoS_2$ film and the substrate under the film, thereby reducing the contact area between the part and the $MoS_2$ film and reducing the friction. It has also been reported that such techniques can increase the corrosion resistance of the substrate.

However, such techniques have not addressed directly or provided any means for the effective suppression of the columnar growth structure in deposited thin films, which has remained as a critical problem in such films in the case of deposited films intended for use as solid lubricants.

Certain prior art configurations of $MoS_2$ thin films have used bilayer or duplex structures in which a single layer of $MoS_2$ is combined with a layer of another material selected for certain properties For example, one of the problems associated with the use of $MoS_2$ films is the difficulty of assuring adhesion to certain substrates on ehich such films are deposited. In order to enhance adhesive properties under such conditions, a thin interlayer is first deposited the substrate and the $MoS_2$ layer then deposited on the interlayer, the material of which is selected to be compatible with the adhesion of the $MoS_2$ layer thereto. For example, chemically activated interlayers of rhodium or palladium on steel have been found to promote $MoS_2$ film adhesion.

In another prior art duplex layer structure, the material of the interlayer which is first deposited on the substrate is selected to provide a hard undersurface for the relatively soft $MoS_2$ layer which is deposited on top of it, thereby to enhance the hardness of the duplex layer by reason of the firm platform. Hard interlayers of titanium carbide or chromium silicide may, for example, be used for such applications.

The basic problem of the limitation of the useful life of such films has remained, however, limited as explained above by the formation of the columnar structures at film thicknesses above certain critical levels.

SUMMARY OF THE INVENTION

The present invention pertains to thin film structures of the foregoing type having greatly increased effective and operative film thicknesses and to methods of forming the same. In one embodiment of the invention, a multilayer structure is formed in which buffer layers of thin film are interposed as thin interlayers between a plurality of spaced layers of the operative film and wherein the thicknesses of the individual layers of the operative film are limited so that each is less than the threshold level at which the onset of structural growth defects and irregularities, such as, for example, columnar growth structures, becomes pronounced. Thus, while the total aggregate thickness of the operative film layers is much greater than the threshold level at which the columnar growth structures form as significant elements of the structure, the individual layers are all of a thickness which is less than such threshold level, and the presence of the columnar and other irregular growth structures is thus avoided in the composite film.

In one embodiment of the method of the present invention, thin film layers of an interlayer material such as, for example, nickel, gold or silver, are deposited between thicker $MoS_2$ layers, thereby effectively eliminating the columnar growth of the $MoS_2$ films. With the appropriate interlayer material and layer thickness, the resulting solid lubricant film provides a performance which exceeds that of a similar thickness of the best pure $MoS_2$ films and has the additional benefit of improved reproducibility by reason of the more uniform film structure.

In addition, the interlayers provide a plurality of diffusion barriers which reduce the degradation rate of the $MoS_2$ films when the structure is exposed to moisture and/or oxygen. In addition, it is believed that the multilayer structures synthesized in accordance with the present invention provide improved toughness and modulus over the pure $Mos_2$ films. Such toughening is the result of interference with crack propagation and the reduction of frequency of initiation of crack sites.

Finally, basal plane orientation is achieved in the $MoS_2$ layers, further improving the solid lubricating properties and reducing diffusion through the structure by reason of the attainment of a higher density film.

The invention is generally applicable to thin film structures wherein an effective layer thickness of a selected material is desired which is greater than that typically available in a single layer deposition because of the formation of the columnar structure at thicknesses which approach the desired thickness. The invention is also particularly applicable to $MoS_2$ thin film structures wherein unique advantages of the foregoing and related nature are realized. The invention is applicable to the general class of solid lubricants which are deposited in thin film form and is preferably a sulfide, a selenide or a telluride of a metal of Group IV, V, VI or VII of the periodic table such as $ZrS_2$, $VS_2$, $NbS_2$, $TaS_2$, $TiS_2$, $MoS_2$, $WS_2$, $ReS_2$, $WSe_2$, $MoSe_2$, $NdSe_2$, $MoTe_2$ or $WTe_2$ and other solid lubricant materials with similar crystallographic structures. The solid lubricant material may also be a fluoride such as graphite fluoride, $CaF_2$ or $BaF_2$, or a chloride such as $CdCl_2$ or $CrCl_2$, an iodide such as $CdI_2$, a nitride such as BN, an oxide such as PdO, talc, $SbO_3$ or $MoO_3$ or graphite.

In still another embodiment of the present invention, which may be implemented either in a multilayer or a duplex layer format, a moisture and/or corrosion resistant outer layer is deposited on the surface of the thin film solid lubricant layer, such as on the otherwise exposed surface of a thin film of $MoS_2$ or other solid lubricant material, to inhibit or prevent moisture and other contaminants from entering the relatively porous layer of the solid lubricant material Such composite structure has an extended shelf life which is particularly important in certain applications where such structures must remain inactive for long periods of time, sometimes in particularly hostile environments, but yet retain full useful properties when put into use. Gold is a particularly preferred material for this embodiment since it is inert and acts as an effective protective layer and is also relatively soft and non-abrasive and therefore useful in a lubricating environment. Because it is relatively soft, it also wears away rapidly in operation, thereby exposing the underlying layer of solid lubricant.

The arrangement of the last described embodiment may be used with either the multilayer structure wherein a plurality of interleaved primary and capping layers are provided as in the embodiments described above or in a bilayer structure with a single layer of solid lubricant, forming therewith a composite bilayer in which the outer surface of the solid lubricant is sealed and protected against corrosive and other deleterious effects which would otherwise significantly limit shelf life, all without materially adversely affecting the performance of the solid lubricant layer in the performance of its intended function.

The advantages of the present invention are of particular importance in the lubrication of moving mechanical assemblies such as used in spacecraft applications and other low pressure environments which involve problems in tribology (friction, wear and lubrication). While the present invention has been summarized in exemplary form in connection with MoSz solid lubricant films, the invention is equally applicable to deposited solid lubricant thin films formed of other materials as will be hereinafter explained in further detail.

DETAILED DESCRIPTION OF THE INVENTION

Figure 1:
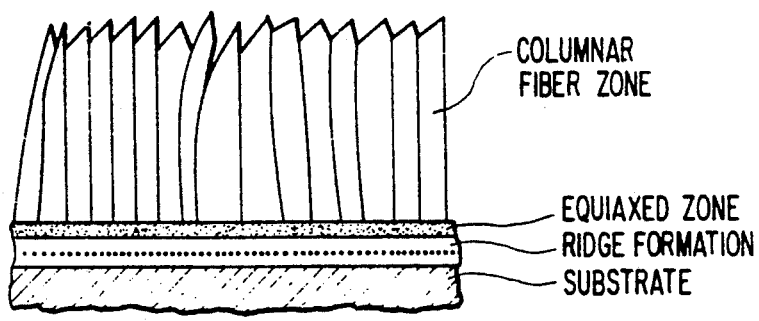
FIG. 1 is a cross-sectional view of a thin film of $MoS_2$ deposited by typical prior art methods and illustrating the columnar growth structure which occurs in the growth of such films during deposition thereof.
Figure 2:
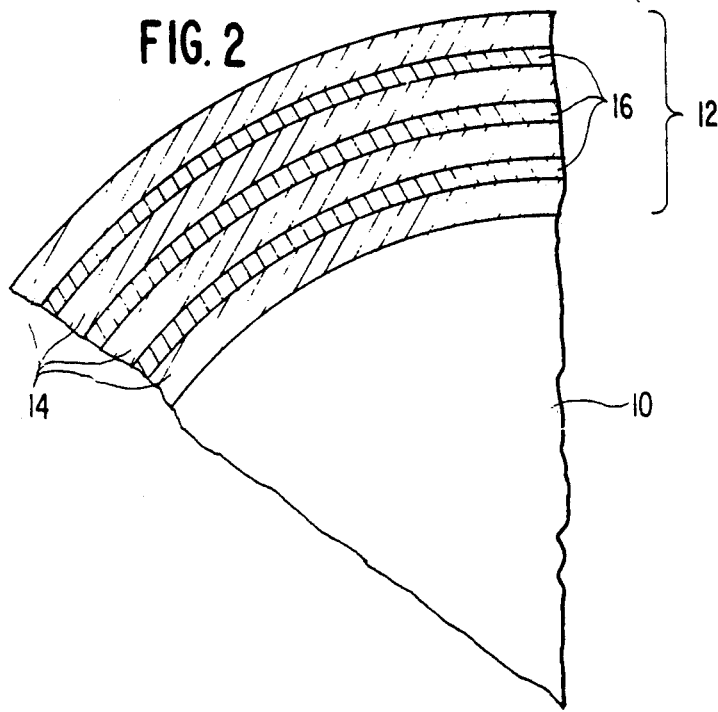
FIG. 2 is a fargmentary, cross-sectional view of a portion of a cylindrical shaft coated with a mutilayer, $MoS_2$ composite thin film lubricating structure deposited in accordance with and embodying the present invention.

Referring now to embodiment of FIG. 2, there is shown a cross-sectional view of a portion of a shaft 10 having deposited thereon in accordance with the method of the present invention a multilayer, composite structure 12 which comprises a plurality of separately deposited layers 14 of $MoS_2$ separated by interlayers 16. The composite multilayer structure of FIG. 2 is greatly simplified for purposes of illustration and shows only a few layers each of the active layers 14 and the interlayers 16, it being understood that the composite structure 12 may consist of many more layer pairs, as many as 200 to 300 or more, of the layers 14 and 16.

For a composite structure utilizing $MoS_2$ films, the individual thicknesses of the $MoS_2$ active layers 14 may, for example, be in the range of about 100 to 200 angstroms or so without incorporation of incipient growth defects and the interlayers 16 may be as thin as two atomic layers of a morphology controlling capping material such as gold or silver or nickel, for example. The active solid lubricant layers 14 may be as thick as about 2,000 angstroms before actual columnar growth becomes pronounced, although as will be explained later, incipient growth defects and irregularities begin to occur in some cases at thicknesses as small as 100 to 200 angstroms. As noted above, the actual composite multilayer structure may include a relatively large number of layer pairs of active layers 14 and buffer interlayers 16, as many as several hundred layer pairs, for example, in a given structure.

In fact, no inherent limit on the number of layer pairs which can be employed in accordance with the present invention has been found, although it is to be understood that the physical environment in which the invention is to be used and the available volume and the structural and other properties of the components will impose certain practical limits on the number of layer pairs which will be possible or optimum for any given application.

The composite multilayer structure of FIG. 2 is formed by the sequential and alternating deposition of the active layers 14 and the interlayers 16 such that an interlayer 16 is deposited in between each adjacent pair of the active layers 14. The thickness of each of the active layers 14 is selected such that the deposition process is stopped prior to reaching a thickness at which the onset of the formation of any substantial incipient growth defects, such as incipient columnar formations, occurs in the layer 14.

The thin interlayers 16 are formed of a relatively non-abrasive and preferably soft material, such as gold or silver, and are sufficiently thin relative to the thickness of the primary or active layers 14 so that the interlayers 16 wear rapidly when exposed to the lubricating interface while, at the same time, enhancing or at least not adversely affecting the lubricating function of the primary layers 14 in the composite structure. Nickel has also been found to be effective as an interlayer material.

The interlayers 16 should preferably be at least several atomic monolayers in thickness in order to be effective as a base for deposition of the next layer of solid lubricant and as a barrier against the further growth of any incipient irregularities from the underlying layer. At least one atomic monolayer is thus required in order to assure complete coverage of the underlying layer, and at least several atomic monolayers, typically 2 to 5 angstroms, are therefore preferred as a minimum thickness for the interlayers 16.

The maximum of the interlayers can, of course, be substantially greater than the preferred minimum thickness of at least several atomic monolayers, but it is preferred that the interlayers 16 be kept as thin as is reasonably feasible in relation to the material selected and the deposition conditions in order to minimize the effect of the interlayers on the primary lubricating function of the solid lubricant primary layers 14. In other words, the interlayers should be selected, both as to material composition and as to thickness, so as to wear away rapidly when exposed and to perform as an interim lubricant with limited though modest lubricating properties during the very short intervals when the interlayer 16 is worn through to the next underlying solid lubricant layer 14.

As explained above, the thickness of the solid lubricant layers 14 may extend all the way up to the point of growth of the columnar structures, which may typically be in the range of 2000 angstroms or so in the case of $MoS_2$, but is more preferably selected to be less than about 200 angstroms or so for $MoS_2$ deposited solid lubricants, which is the point where incipient growth defects and irregularities may actually begin to occur in such $MoS_2$ films. Such incipient growth defects and irregularities begin to occur at different thicknesses for different compositions of solid lubricant materials and the preferred thickness is thus selected in each case for the particular material being deposited.

In one embodiment of the invention, employing deposited $MoS_2$ thin films as the solid lubricant layers 14 and gold as the interlayers 16, it was found that thicknesses of the solid lubricant layers 14 of about 100 to 200 angstroms in combination with thicknesses of the gold interlayers 16 of about 2 to 5 angstroms formed a particularly effective multilayer structure for composite structures of one hundred or so layer pairs of gold and $MoS_2$.

Figure 3:
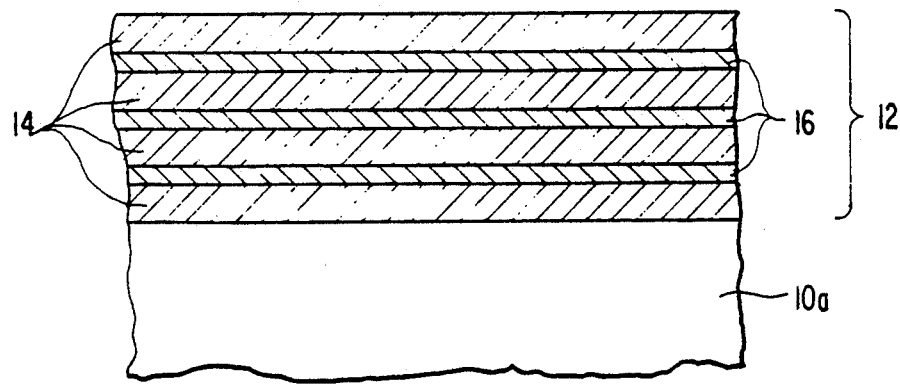
FIG. 3 is a fragmentary, cross-sectional view of a portion of a substantially flat substrate coated with a multilayer, MoSz composite thin film lubricating structure deposited in accordance with and embodying the present invention.

Another embodiment is shown in FIG. 3 in which the composite multilayer structure 12 formed of the solid lubricant layers 14 and the intermediate layers 16 is deposited on a flat substrate 10a. Except for being deposited on a flat substrate 10a, the composite multilayer structure 12 is the same as in FIG. 2. The multilayer structure 12 may be formed on any substrate of any shape where a solid lubricating thin film is desired.

Figure 8:
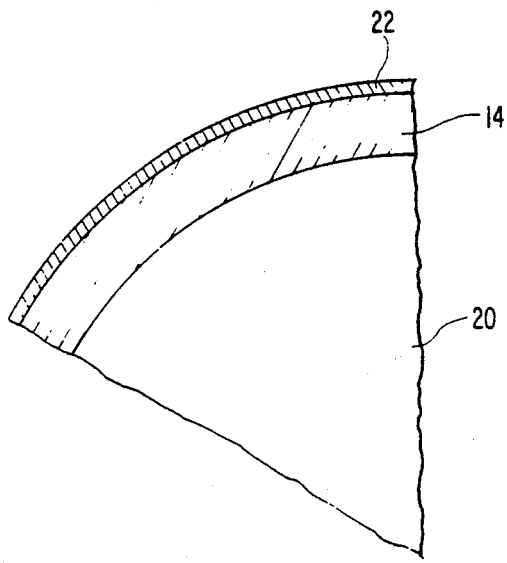
FIG. 8 is a fragmentary, cross sectional view of a portion of a cylindrical shaft illustrating another embodiment of the multilayer, composite solid lubricant structure of the present invention.

Another embodiment of the present invention is shown in FIG. 8, in which a cylindrical shaft, a portion 20 of which is illustrated in the fragmentary view, is provided with a deposited layer 14 of a solid lubricating material, such as $MoS_2$ or any other selected solid lubricant as described herein. Deposited over the selected solid lubricant layer 14 is an outer capping layer 22 which is impervious to moisture and other contaminants which would otherwise attack the lubricant layer 14 and thereby limit the shelf life of the system.

The capping layer 22 is formed of a relatively soft material which is inert and non-porous and impervious to moisture and oxygen. The material of the layer 22 is therefore itself resistant to corrosion and it also shields the underlying solid lubricant layer 16 from exposure to moisture, oxygen and other corrosive elements and contaminants. The soft capping layer is rapidly worn off when the system is put into use, thus exposing the active sold lubricant layer 14 which has been protected during the shelf life period by the capping layer 22 against corrosion and other deleterious effects.

Figure 9:
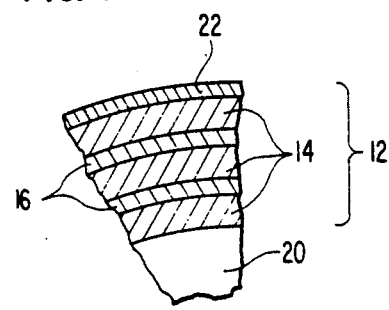
FIG. 9 is a fragmentary, cross sectional view of a portion of a cylindrical shaft illustrating another configuration of the embodiment of FIG. 8.

Another configuration of the embodiment of FIG. 8 is shown in FIG. 9 in which the capping layer 22 is used in combination with the multilayer structure 12 comprising the layers 14 of deposited solid lubricant material and the interlayers 16 forming the composite multilayer structure as illustrated in FIG. 2.

The phrase "relatively soft material" as used herein means a material which is soft and non-abrasive when brought into contact with the material with which it interfaces in the performance of its function and which will wear away rapidly as a result of such contact and without materially adversely affecting the lubricating function of the composite structure. The material of the capping layer 22 thus has at least moderate lubricating properties capable of interfacing with the adjoining material during the period in which the capping layer is worn away.

Gold has been found to be particularly effective as a material for the capping layer 22. Other noble metals also have similar properties and are also preferred. These are silver, platinum and palladium. Still other relatively soft and corrosion resistant metals such as lead, indium and tin also have similar properties. All of these materials are relatively soft and inert and therefore are suitable as materials for the capping layer 22.

Figure 10:
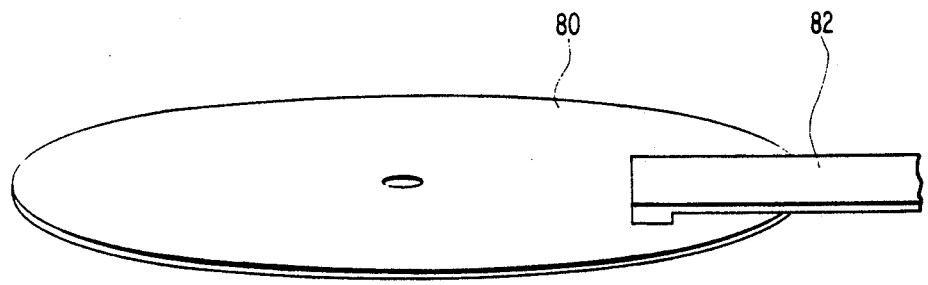
FIG. 10 is a perspective view of a memory disk manufactured in accordance with and embodying the present invention.
Figure 11:
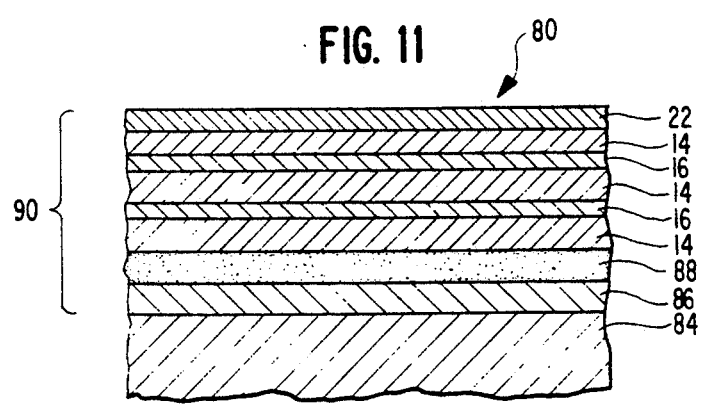
FIG. 11 is a partial cross sectional view of a portion of the memory disk of FIG. 10.

Referring now to the embodiment of FIGS. 10 and 11, there is shown in FIG. 10 a memory disk 80 which is adapted to interface with a record/read head 82 for storing and retrieving information in a memory layer on the disk 80. Shown in FIG. 11 is a partial cross sectional view of the memory disk 80 which is formed of a substrate portion 84 of the disk 80 and a thin layer 86 of recording medium formed thereon. In the embodiment shown, the recording layer 86 is formed of a magnetic recording medium although other types of media can, of course, be utilized.

Formed over the recording layer 86 is hard layer 88 of a diamond-like material such as crystalline structured carbon formed by chemical vapor deposition or the like. The hard layer 86 is optional Deposited on the hard layer 88 is a composite multilayer solid lubricant structure 90 formed in accordance with the present invention.

The composite multilayer solid lubricant layer 90 is formed of solid lubricant layers 14 and intermediate layers 16 in a multilayer structure as described above A capping layer 22 may be formed on the top of the multilayer structure 90. While the capping layer 22 may be provided to add protection to the disk structure in the form of enhancing the shelf life as described above, it is not required and may be omitted where the extended shelf life is not a requirement.

The composite structure 90 formed of the interleaved layers 14 and 16 provides a lubricating layer on the surface of the disk 80 to lubricate and protect the surface of the disk against damage from encounters with the record/read head 82, which may occur accidentally during operation while the disk is rotating or in the course of movement while the system is not operating. The composite structure 90 thus not only provides a buffer layer on the surface of the disk 80, but it also provides lubrication for any contacts with the disk surface and the recording head 82. The preferred thickness ranges of the layers 14 and 16 are as described above in connection with the other embodiments presented. The capping layer 22 may be the same as that described in the embodiment of FIGS. 8 and 9. As noted above, the capping layer 22 is not required in order for the composite structure to perform its lubricating function and may be omitted if the added shelf life protection is not necessary.

As described, the composite structure 90 is formed over the memory medium layer 86, it being understood that other intermediate layers such as the hard layer 88 may be formed between the composite structure 90 and the memory layer 86. The term "over" therefore means extending over the surface of the memory layer 86 and not necessarily in direct contact therewith.

It is also understood that, while a circularly shaped disk 80 is shown, the disk can be of any suitable shape such as in the form of a flat rectangle, for example, adapted to interface with a suitable read and/or record mechanism which is adapted to interface with the surface of the disk in a manner similar to the interfacing of the head 82. The term "disk" is thus meant to include all shapes of planar memory structures having memory layers thereon adapted to interface with a record and/or read head or mechanism.

The solid lubricant material of the primary layers 14 of the embodiments shown and described herein can be any deposited solid lubricant and is preferably a sulfide, a selenide or a telluride of a metal of Group IV, V, VI or VII of the periodic table such as $ZrS_2$, $VS_2$, $NbS_2$, $TaS_2$, $MoS_2$, $WS_2$, $ReS_2$, $WSe_2$, $MoSe_2$, $NdSe_2$, $MoTe_2$ or $WTe_2$. The solid lubricant material may also be a fluoride such as graphite fluoride, $CaF_2$ or $BaF_2$, or a chloride such as $CdCl_2$ or $CrCl_2$, an iodide such as $CdI_2$, a nitride such as BN, an oxide such as PdO, talc, $SbO_3$ or $MoO_3$ or graphite.

Figure 4:
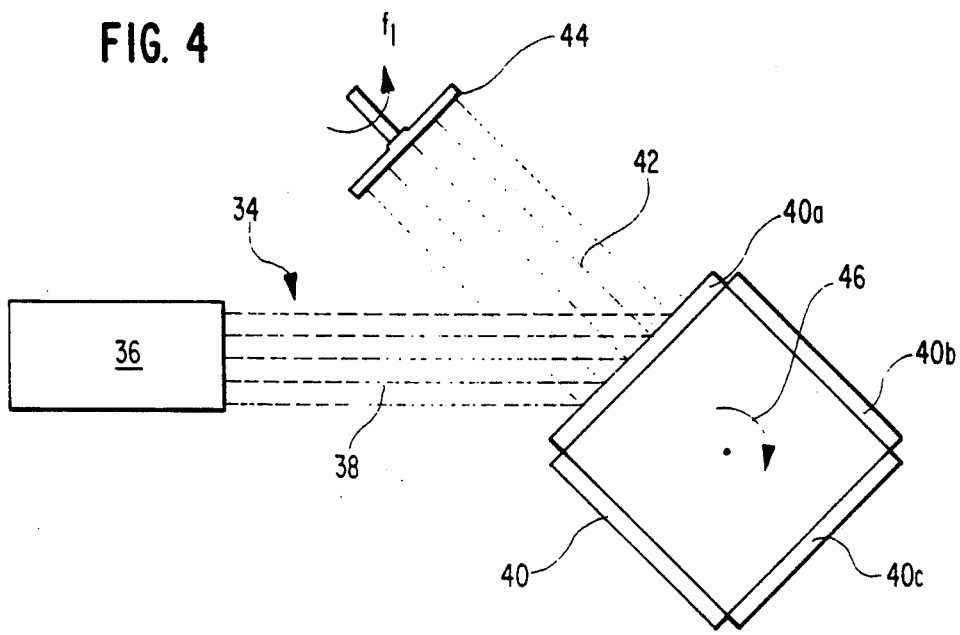
FIG. 4 is is a partial side view diagrammatical representation of one embodiment of an ion beam deposition technique for carrying out the method of and manufacturing the structures of the present invention.
Figure 5:
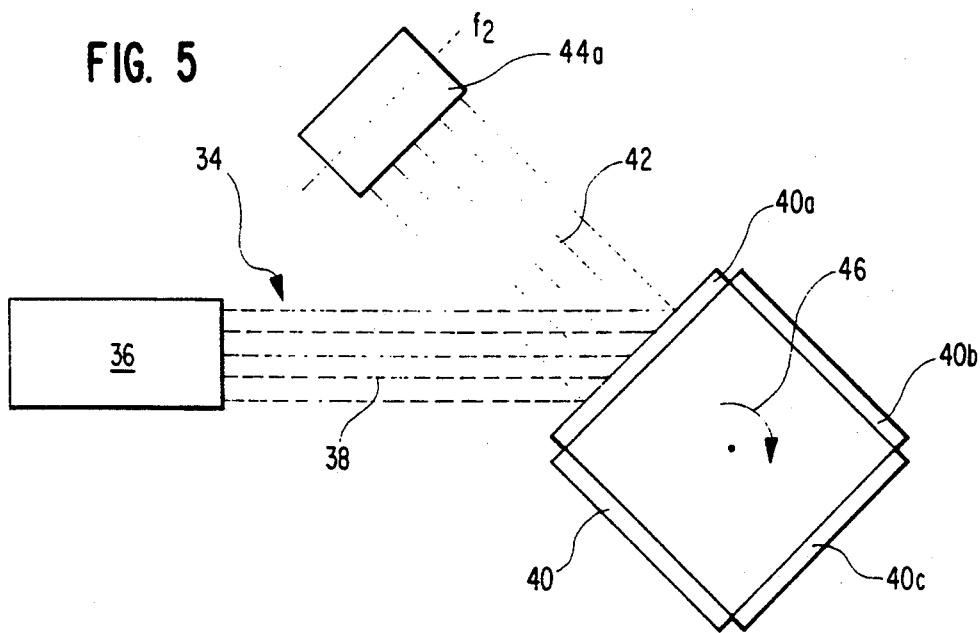
FIG. 5 is a partial side view of a diagrammatical representation of the technique of FIG. 4 for deposition on the outer surface of a cylindrical shaft or other cylindrical surface.
Figure 6:
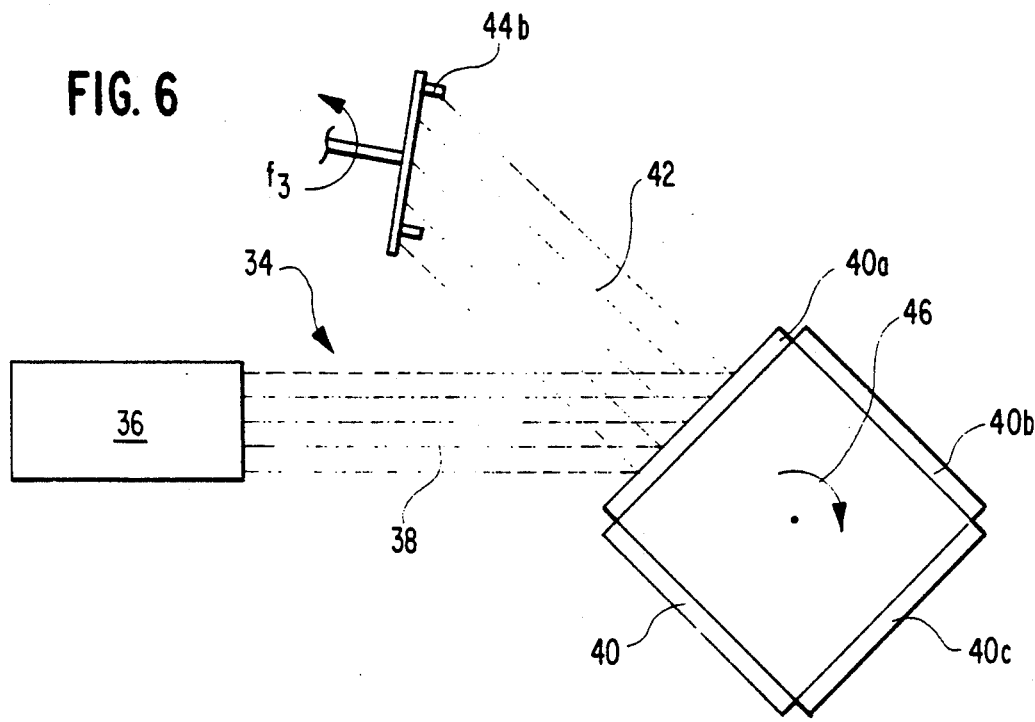
FIG. 6 is a partial side view of a diagrammatical representation of the techniques of FIG. 4 utilized to deposit simultaneously on the inside and outside diameters of a cylindrical surface.

The multilayer structure of the present invention may be formed in various ways. One embodiment of an ion beam deposition system for practicing the method of the present invention to form the multilayer structure of the present invention is shown in FIGS. 4, 5 and 6, in which an ion source 36 is utilized to generate a beam of ions 38 which are neutralized and directed at a selected target 40 containing the materials of which the multilayer structure is to be formed. The beam 38 sputters material from the target 40 into a substantially collimated and uniform stream 42 which is deposited on a suitable substrate 44 as shown in FIG. 4 or on a cylindrical substrates 44a and 44b as shown in FIGS. 5 and 6.

FIG. 4 shows a flat substrate 44 while FIGS. 5 and 6 show cylindrical substrates 44a and 44b. Except for the fact that the substrate 44 is flat and substrate 44a is cylindrical, the embodiment of FIG. 4 is otherwise the same as the embodiments of FIGS. 5 and 6 and the two embodiments are denoted by like numerals to show like elements.

The substrates 44, 44a and 44b can be mounted on holders (not shown) and the system 34 is under vacuum which can be substantially lower than that utilized in magnetron or diode sputtering. The substrates 44, 44a and 44b can also be heated or cooled as desired to affect the structure of the material being deposited in accordance with deposition techniques for such materials well known in the art.

As best illustrated in FIG. 4, the ion source 36 is preferably of a substantially circular or round cross section source which generates a substantially round section beam 38. The flat substrate 44 is rotatably mounted on a central axis as shown and is rotated preferably at a selected frequency $f_1$ to assure an even deposition across the substrate 44, preferably in the range of 10-20 rpm. The cylindrical substrates 44a and 44b are also rotatably mounted on their central linear axes and are rotated during deposition in the same manner as the flat substrate 44 at selected frequencies $f_2$ and $f_3$. The targets 40, 40a, 40b and 40c are each formed from a different material respectively to form the desired materials of the selected solid lubricating material 14 and the selected interlayer 16 when deposited on the substrate 44. Each target is rotated about the mounting axis as shown by the arrow to position the target of the selected material in position for deposition of the selected material for each layer.

For example, the round target 40a is formed of a selected composition to form the desired material of the solid lubricating material 14 when deposited on the substrate 44 and the section 40b is formed of a selected composition to form the selected material of the interlayer 16. It is understood that the compositions of the sections 40a and 40b are to be selected such that due allowance is made for the deposition process such that the desired compositions of the solid lubricant and the interlayer material are deposited on the substrates 44, 44a and 44b when subjected to the ion beam 38.

The targets 40, 40a, 40b and 40c are mounted so as to be rotatable in the directions of the arrows shown in FIGS. 4, 5 and 6 such that any of the round targets 40a, 40b or 40c can be aligned with the ion beam 38 impinging on them. Thus, for a two component multilayer, either the target 40a or the target 40b can be aligned so that the deposition is made from the material of the selected target 40a or 40b.

In order to form each of the layers 14 of the solid lubricant in the structure of FIGS. 2, 3, 8 and 9, the target block 40 is rotated to the position where the appropriate target is aligned with the ion beam cross section 36. The ion source 36 is activated and the deposition is made by removal of material from the selected target 40–40c by the impinging ion beam 38 and the deposition thereof on the rotating flat substrate 44 or cylindrical substrates 44a and 44b. When the desired thickness of the solid lubricant layer 14 is attained, and this can be determined in any well known manner such as by controlling the deposition time where the rate of deposition on the substrate is known, the target block 46 is rotated to align another selected target, say 40a, with the impinging ion beam cross section 36. The ion beam source may be allowed to remain on during the rotation of the target from one position to the other or it more preferably is turned off momentarily during the rotation to minimize contamination.

With the target 40a now aligned with the impinging ion beam cross section, the deposition is continued to form an interlayer 16 from the material of the target 40a. Deposition is continued under this alignment condition until an interlayer 16 of the desired thickness is formed on the solid lubricant layer 14 and the target block 46 is then rotated back to the position aligning the target 40 with the ion beam 38 for the formation of another solid lubricant layer 14. The solid lubricant layers 14 and the interlayers 16 are thus formed in alternating layers as shown as in the embodiments of FIGS. 2 and 3. The embodiment of FIG. 8 may also be formed, as shown in FIG. 9, of a multilayer structure in place of the single layer 14 of solid lubricant with the capping layer 22 then being formed on the outer surface of the composite structure so formed.

Figure 7:
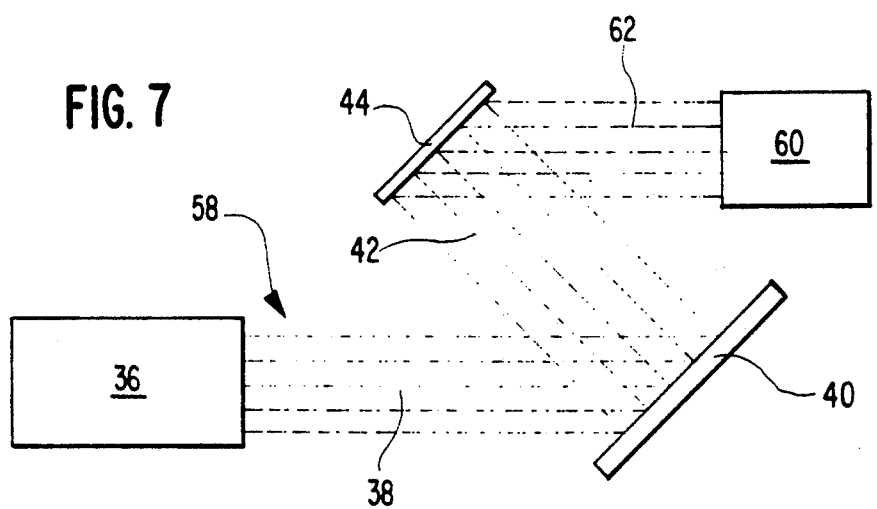
FIG. 7 is a partial diagrammatical representation of a another embodiment of a deposition technique for carrying out the method of and manufacturing the structures of the present invention.

Another embodiment of a deposition system for practicing the present invention is shown in FIG. 7, which can be identical to the embodiment of FIGS. 4, 5 and 6 with the addition of a second ion beam source 60. The ion beam source 60 generates an ion beam 62 which can be formed from argon and/or nitrogen and/or other suitable reactive gases, materials or combinations thereof The reactive ion beam can be utilized to control the morphology of the materials in a selected layer or in all layers. In the embodiment of FIG. 7, the flat substrate 44 is again rotatably mounted and rotated at a selected speed and the target block 46 is rotated back and forth in front of the beam 38 and held in each position to form the respective solid lubricant layers 14 and the interlayers 16.

Various other deposition methods and techniques may, of course, be used to form the multilayer structures of the present invention and to practice the method of the present invention. Other suitable techniques for depositing materials on a substrate are shown and described, for example, in U.S. Pat. No. 4,727,000, issued Feb. 23, 1988 in the names of Stanford R. Ovshinsky et al., the subject matter of which is incorporated herein by reference.

While the present invention and the embodiments presented herein have been set forth and described in detail for the purposes of making a full and complete disclosure of the subject matter thereof, the disclosure herein presented is not intended to be limiting in any way with respect to the true scope of this invention as the same is set forth in the appended claims.

We claim:

1. A composite, multilayer, solid lubricating film structure having a growth pattern formed by deposition on a substrate comprising a plurality of thin film layers of a solid lubricant material interleaved by thin film interlayers of an interlayer material, said thin film layers of solid lubricant material having individual thicknesses less than that at which a substantial growth defects are formed in the growth pattern thereof and said interlayers having individual thicknesses substantially less than the individual thicknesses of said thin film layers of solid lubricant material, wherein said thin film layers of soft lubricant material comprises one or more materials selected from the group consisting of a sulfide of a metal of Group IV,V,VI,VII, a selenide of a metal of Group IV,V,VI,VII, a telluride of a metal of Group IV,V,VI,-VII, a fluoride, a chloride, an iodide, a nitride, an oxide and graphite.

2. A composite, multilayer, solid lubricating film structure as set forth in claim 1 wherein the individual thicknesses of said thin film layers of solid lubricant material are less than about 2000 angstroms.

3. A composite, multilayer, solid lubricating film structure as set forth in claim 2 wherein the individual thicknesses of said interlayers are from about 2 angstroms to about 100 angstroms.

4. A composite, multilayer, solid lubricating film structure as set forth in claim 1 wherein said thin film layers of solid lubricant material comprise $MoS_2$.

5. A composite, multilayer, solid lubricating film structure as set forth in claim 1 wherein said thin film layers of solid lubricant material comprise $MoS_2$ with the individual thicknesses thereof being less than about 200 angstroms, and the individual thicknesses of said interlayers are from about 2 angstroms to about 100 angstroms.

6. A composite, multilayer, solid lubricating thin film structure wherein said thin film layers of soft lubricant material comprises one ore more materials selected from the group consisting of a sulfide of a metal of Group IV,V,VI,VII, a selenide of Group IV,V,VI,VII, a tellluride of a metal of Group IV,V,VI,VII, a fluoride, a chloride, an iodide, a nitride, an oxide and graphite, and said capping layer comprise one or more elements selected from the group consisting of gold, platinum, palladium, lead, indium and tin formed on a substrate comprising at least one layer of a thin film, solid lubricating material formed on said substrate and a capping layer deposited thereon, said capping layer being a relatively soft material substantially impervious to and substantially chemically inert with respect to moisture and oxygen.

* * * * *

UNITED STATES PATENT AND TRADEMARK OFFICE
CERTIFICATE OF CORRECTION

PATENT NO. : 5,268,216

DATED : December 7, 1993

INVENTOR(S) : John E. Keem, et al

It is certified that error appears in the above-indentified patent and that said Letters Patent is hereby corrected as shown below:

Col. 1, line 40, "process" should be --process.--.

Col. 1, line 61, "structures" should be --structure--.

Col. 2, line 4, "Technol" should be --Technol.--.

Col. 2, line 27, "structures" should be --structures.--.

Col. 2, line 31, "Technol" should be --Technol.--.

Col. 3, line 26, "properties" should be --properties.--

Col. 4, line 55, "material" should be --material.--

Col. 5, line 18, "MoSz" should be --$MoS_2$--.

Col. 5, line 36, "MoSz" should be --$MoS_2$--.

Col. 6, line 20, "twc" should be --two--.

Col. 8, line 40, "optional" should be --optional.--.

Col. 8, line 46, "above" should be --above.--.

Col. 11, line 4, "thereof" should be --thereof.--.

UNITED STATES PATENT AND TRADEMARK OFFICE
CERTIFICATE OF CORRECTION

PATENT NO. : 5,268,216
DATED : December 7, 1993
INVENTOR(S) : John E. Keem et al It is certified that error appears in the above-indentified patent and that said Letters Patent is hereby corrected as shown below:

Column 12, line 29, "tellluride" should be --telluride --.

Signed and Sealed this

Fourteenth Day of June, 1994

Attest:

BRUCE LEHMAN

Attesting Officer    Commissioner of Patents and Trademarks